US012677408B2

(12) United States Patent
Kakumu et al.

(10) Patent No.: US 12,677,408 B2
(45) Date of Patent: Jul. 7, 2026

(54) MEMORY DEVICE USING SEMICONDUCTOR ELEMENT

(71) Applicant: Unisantis Electronics Singapore Pte. Ltd., Singapore (SG)

(72) Inventors: Masakazu Kakumu, Tokyo (JP); Iwao Kunishima, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 121 days.

(21) Appl. No.: 18/942,990

(22) Filed: Nov. 11, 2024

(65) Prior Publication Data

US 2025/0169054 A1     May 22, 2025

(30) Foreign Application Priority Data

Nov. 17, 2023    (WO) .................. PCT/JP2023/041433

(51) Int. Cl.
*G11C 11/404*     (2006.01)
*G11C 11/4096*     (2006.01)
*H10B 12/00*     (2023.01)

(52) U.S. Cl.
CPC ............ *H10B 12/20* (2023.02); *G11C 11/404* (2013.01); *G11C 11/4096* (2013.01)

(58) Field of Classification Search
CPC .... G11C 11/404; G11C 11/4096; H10B 12/20
(Continued)

(56) References Cited

U.S. PATENT DOCUMENTS

| | | | |
|---|---|---|---|
| 11,776,620 B2 | 10/2023 | Sakui et al. | |
| 2003/0111681 A1 | 6/2003 | Kawanaka | |

(Continued)

FOREIGN PATENT DOCUMENTS

| | | | | |
|---|---|---|---|---|
| CN | 113424319 B | * | 11/2024 | ............ H10P 50/283 |
| JP | 02-188966 | | 7/1990 | |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's" IEEE Transaction on Electron Devices, vol. 38, No. 3, pp. 573-578 (1991) (6 pages).

(Continued)

*Primary Examiner* — Ly D Pham
(74) *Attorney, Agent, or Firm* — Crowell & Moring LLP

(57) ABSTRACT

Provided is a memory semiconductor device in which a p-type semiconductor region is formed at an n+layer to which a bit line is connected, an n-type semiconductor layer to which a source line is connected is further formed, a first gate insulating layer and a first gate conductor layer to which a word line is connected exist, a second gate insulating layer and a second gate conductor layer to which a plate line is connected are provided, and a distance from the n+layer to the first gate conductor layer is smaller than a distance up to the second gate conductor layer. At the time of an erase operation, the plate line and the source line have a positive electric potential of the same polarity or have a voltage of 0 V.

12 Claims, 17 Drawing Sheets

(58) Field of Classification Search
USPC ........................................................ 365/184
See application file for complete search history.

(56) References Cited

U.S. PATENT DOCUMENTS

| | | | |
|---|---|---|---|
| 2008/0009115 A1* | 1/2008 | Willer | H10B 69/00 |
| | | | 438/257 |
| 2008/0137394 A1 | 6/2008 | Shimano et al. | |
| 2009/0251959 A1 | 10/2009 | Fukuda | |
| 2023/0077140 A1 | 3/2023 | Kakumu et al. | |
| 2023/0106561 A1 | 4/2023 | Hsu | |
| 2023/0269926 A1 | 8/2023 | Hsu | |
| 2023/0335183 A1 | 10/2023 | Sakui et al. | |

FOREIGN PATENT DOCUMENTS

| | | |
|---|---|---|
| JP | 2009-252264 | 10/2009 |
| JP | 2023-512561 | 3/2023 |
| WO | WO 2021/162856 A1 | 8/2021 |
| WO | WO 2023/199474 A1 | 10/2023 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 Dram Cell with Vertical Pillar Transistor(VPT)," 2011 Proceeding of the European Solid-State Device Research Conference, (2011) (4 pages).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012) (3 pages).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32mm Node and Beyond," IEEE IEDM (2006) (4 pages)

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, June 2017 (2 pages).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006. (6 pages)

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron, vol. E90-c., No. 4 pp. 765-771 (2007) (7 pages).

K. Sakui, N. Harada,"Dynamic Flash Memory with Dual Gate Surrounding Gate Transistor (SGT)," Proc. IEEE IMW, pp. 72-75 (2021) (2 pages).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002) (13 pages).

H. Miyagawa et al. "Metal-Assisted Solid-Phase Crystallization Process for Vertical Monocrystalline Si Channel in 3D Flash Memory", IEDM 19 digest paper, pp. 650-653 (2019) (4 pages).

International Search Report and Written Opinion in International Application No. PCT/JP2023/041433 (in Japanese) completed on Jan. 22, 2024 (9 pages).

* cited by examiner

FIG. 2A
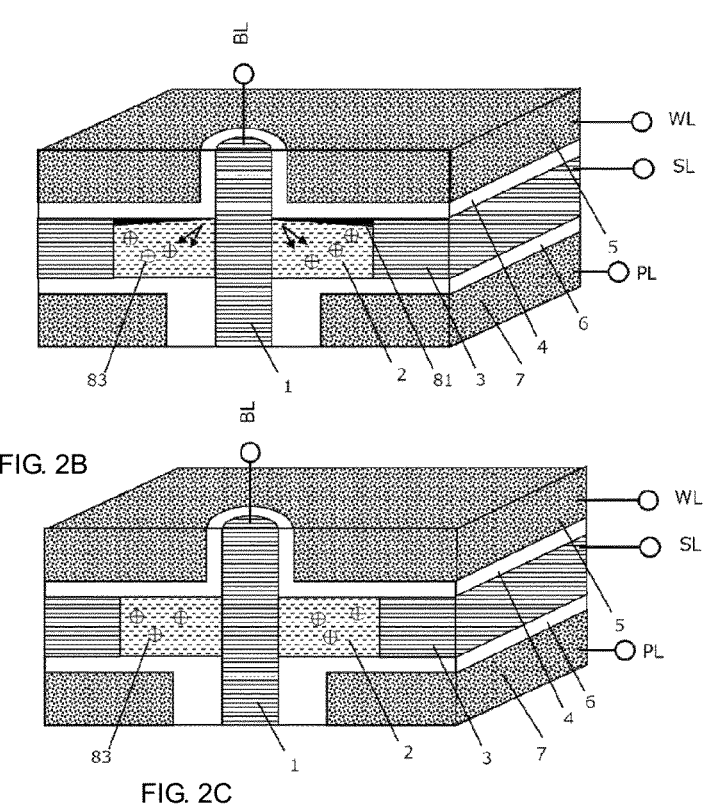
FIG. 2B
FIG. 2C
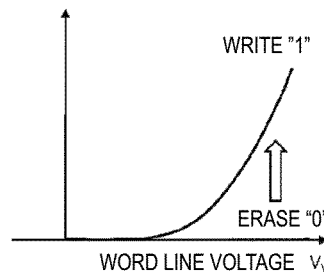
FIG. 2D
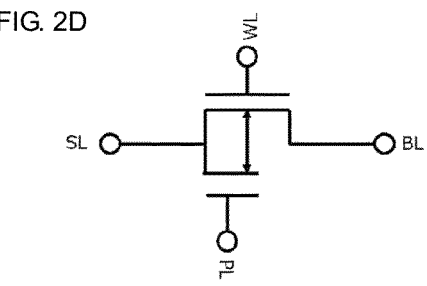

CELL CURRENT
Icell  (BL to SL Current)

WRITE "1"

ERASE "0"

WORD LINE VOLTAGE  $V_{WL}$

MEMORY DEVICE USING SEMICONDUCTOR ELEMENT

CROSS REFERENCES TO RELATED APPLICATIONS

This application claims priority to PCT/JP2023/041433, filed Nov. 17, 2023, the entire content of which is incorporated herein by reference.

BACKGROUND OF THE INVENTION

1. Field of the Invention

The present invention relates to a memory device using a semiconductor element.

2. Description of the Related Art

In recent years, in LSI (Large Scale Integration) technology developments, there has been a demand for higher integration, higher performance, lower power consumption, and higher functionality of a memory device where a logic circuit using a semiconductor element can be mounted.

As a memory of an integrated circuit, DRAM (Dynamic Random Access Memory) is widely used. There are, for example, DRAM (see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)) using, in order to increase the density of DRAM, an SGT structure extending in a direction perpendicular to an upper surface of a semiconductor substrate (see, for example, Japanese Unexamined Patent Application Publication No. 2-188966, and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)); and a DRAM cell that does not include a capacitor and that is constituted by one MOS transistor (see, for example, T. Ohsawasa, K. Fujita, T. Higashi, Y. Iwata, T. Kajiyama, Y. Asano, and K. Sunouchi, "Memory Design Using a One-Transistor Gain Cell on SOI," IEEE Journal of Solid State Circuits, Vol. 37, No. 11, pp. 1510-1522 (2002); J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); and E. Yoshida: "A Capacitorless IT-DRAM Technology Using Gate-Inducted Drain-Leakage (GIDL) Current for Low-Power and High-Speed Embedded Memory," IEEE IEDM (2006)). These are commonly called "ITDRAM". For example, among a hole group and an electron group produced by an impact ionization phenomenon in a channel by a source-drain electrical current of an n-channel MOS transistor, a part of or the entire hole group is held in the channel to write logical storage data "1". Then, the hole group is removed from the channel to write logical storage data "0". However, this structure has a problem in that, when a voltage is applied to a selected cell, an undesired signal is input to an unselected cell, as a result of which the unselected memory cell malfunctions.

There is a twin-transistor MOS transistor memory element in which one memory cell is formed on an SOI layer by using two MOS transistors (see, for example, US 2008/0137394 A1; US 2003/0111681 A1; and F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., Vol. E90-c., No. 4, pp. 765-771 (2007)). There is further DFM (Dynamic Flash Memory) in which a capacitor is not provided and one memory cell is constituted by two gate electrodes (see, for example, US 2023/11776620 B2; and K. Sakui, N. Harada, "Dynamic Flash Memory with Dual Gate Surrounding Gate Transistor (SGT)," Proc. IEEE IMW, pp. 72-75 (2021)). In this memory cell, by manipulating the voltages of four electrodes, the carrier concentration inside a floating body is changed and a conductive state or a nonconductive state is produced to operate the memory. For example, a structure in which a body for accumulating carriers is connected to a lower portion of a MOS transistor is also proposed (see, for example, US 2023/0077140 A1). Further, there is DRAM in which, in order to achieve higher density, 1TDRAMs formed by using sacrificial layers are three-dimensionally stacked (see, for example, US 2023/0106561 A1 and US 2023/0269926 A1). However, since the memory element is also 1TDRAM, there remain problems in the memory element that are peculiar to 1TDRAM, such as unstable DRAM operations.

SUMMARY OF THE INVENTION

Accordingly, it is an object of the present invention to, in order to realize a high-density memory, three-dimensionally laminate memory cells and provide stable memory operations.

To this end, a memory cell using a semiconductor element according to a first aspect of the present application includes:

a first semiconductor region that extends in a direction perpendicular to a substrate;

a second semiconductor region that surrounds a part of the first semiconductor region and that is connected thereto;

a third semiconductor region that surrounds a part of the second semiconductor region and that is connected thereto;

a first dielectric film that covers a part of an upper surface of the second semiconductor region;

a first gate conductor layer that contacts an upper surface of the first dielectric film;

a second dielectric film that covers a part of a lower surface of the second semiconductor region; and a second gate conductor layer that contacts the second dielectric film and whose shortest distance from the first semiconductor region is larger than a shortest distance between the first gate conductor layer and the first semiconductor region, in which the memory cell is configured such that a source line is connected to the third semiconductor region, a bit line is connected to the first semiconductor region, a word line is connected to the first gate conductor layer, a plate line is connected to the second gate conductor layer, and a voltage is applied to each of the source line, the bit line, the plate line, the word line, and a control line to perform a write operation, an erase operation, and a read operation, and when the erase operation of the memory cell is performed, the voltage is applied to only either one of the source line and the bit line.

In a second aspect according to the first aspect, when the read operation or the write operation is performed, polarities of the voltages that are applied to the bit line and the word line are same and differ from a polarity of the voltage that is applied to the plate line.

In a third aspect according to the first aspect, when the erase operation is performed, a voltage having a polarity that is same as a polarity of the voltage that is applied to the plate line is applied to either one of the source line and the bit line, or the voltages that are applied to the source line and the bit line are both 0 V.

In a fourth aspect according to the first aspect, the second dielectric film is thicker than the first dielectric film.

In a fifth aspect according to the first aspect, majority carriers of the first semiconductor region and the third semiconductor region are same and differ from a majority carrier of the second semiconductor region.

In a sixth aspect according to the first aspect, a first metal layer is used in place of the first semiconductor region.

In a seventh aspect according to the sixth aspect, the first semiconductor region is used around the first metal layer.

The memory cell using a semiconductor element of an eighth aspect according to the first aspect further includes a first metal layer that is connected to an inner portion of the first semiconductor region.

In a ninth aspect according to the first aspect, an outer periphery of the third semiconductor region is covered by a metal layer.

A memory device according to a tenth aspect includes a plurality of memory cells, each being the memory cell according to the first aspect, that are laid out in a plane, in which the second semiconductor region, the third semiconductor region, the first dielectric film, the first gate conductor layer, the second dielectric film, and the second gate conductor layer are shared by the plurality of memory cells that are adjacent to each other in a horizontal direction; other than the first semiconductor region, the memory cells are isolated by a first insulating layer in a perpendicular direction; the first semiconductor region is shared by the memory cells in the perpendicular direction; and the plurality of memory cells are laminated in the perpendicular direction.

A memory device according to an eleventh aspect is such that the memory cells according to the tenth aspect are disposed by being isolated by a second insulating layer in the horizontal direction.

In a twelfth aspect according to the tenth aspect, the second gate conductor layer is shared by the memory cells that are adjacent to each other in the perpendicular direction.

A method of producing a memory device according to a thirteenth aspect includes:

forming a laminated structure by alternately depositing a plurality of semiconductor layers, which become second semiconductor layers, and a plurality of first sacrificial layers or a plurality of second sacrificial layers;

forming a perpendicular bit line hole extending through the laminated structure by using a trench process, and introducing an impurity into the semiconductor layers by using an isotropic doping process performed throughout the bit line hole; and subsequently filling the bit line hole with a semiconductor or a metal layer, removing a selected insulating layer that has been deposited, and forming a dielectric film and a gate conductor layer.

In a fourteenth aspect according to the thirteenth aspect, a region of the bit line is made of either one of a metal or polysilicon.

In a fifteenth aspect according to the thirteenth aspect, the first sacrificial layers and the second sacrificial layers have different etching characteristics.

In a sixteenth aspect according to the thirteenth aspect, the first sacrificial layers and materials of the second semiconductor layers, or the second sacrificial layers and the materials of the second semiconductor layers have different etching characteristics.

A method of producing a semiconductor memory device according to a seventeenth aspect includes: replacing with a semiconductor layer while concurrently performing a process in which a laminated structure is formed by alternately depositing three or more sacrificial layers, in which a perpendicular bit line hole that extends through the laminated structure is formed by using a trench process, and in which the perpendicular bit line hole is filled with a semiconductor or a metal layer, and performing a doping process at a location where one of the three or more sacrificial layers has been selectively removed; and removing a selected insulating layer that has been deposited and forming a dielectric film and a gate conductor layer.

In an eighteenth aspect according to the seventeenth aspect, materials of the plurality of sacrificial layers have different etching characteristics.

BRIEF DESCRIPTION OF THE DRAWINGS

FIGS. 2A, 2B, 2C and 2D each illustrate hole carrier accumulation and cell current at the time of a write operation of the memory device using a semiconductor element according to the first embodiment.

FIGS. 5-1A and 5-1B are, respectively, a bird's-eye view of an additional example of the memory device using a semiconductor element according to the first embodiment, and a bird's-eye view without a film at an upper portion.

FIGS. 5-2C and 5-2D are each a bird's-eye view of an additional example of the memory device using a semiconductor element according to the first embodiment.

FIGS. 5-3E is a bird's-eye view of an additional example of the memory device using a semiconductor element according to the first embodiment.

FIGS. 6-1A and 6-1B illustrate, respectively, a state of a lay out of a cell arrangement in FIGS. 1A and 1B of the memory device using a semiconductor element according to the first embodiment, and coordinates of a cell arrangement according to a second embodiment.

FIG. 6-2C is a bird's-eye view without a film at an upper portion in FIG. 6-1A according to the second embodiment.

FIGS. 10-1A and 10-1B each illustrate a method of producing a memory device according to a third embodiment.

FIGS. 10-2C and 10-2D each illustrate the method of producing the memory device according to the third embodiment.

FIGS. 10-3E and 10-3F each illustrate the method of producing the memory device according to the third embodiment.

FIGS. 10-4G and 10-4H each illustrate the method of producing the memory device according to the third embodiment.

FIGS. 11-1A and 11-1B each illustrate an additional example of the method of producing the memory device according to the third embodiment.

FIGS. 11-2C and 11-2D each illustrate the additional example of the method of producing the memory device according to the third embodiment.

FIGS. 11-3E and 11-3F each illustrate the additional example of the method of producing the memory device according to the third embodiment.

DESCRIPTION OF THE PREFERRED EMBODIMENTS

A structure of a memory device using a semiconductor element, a driving method, and the behavior of accumulated carriers according to embodiments of the present invention are described below with reference to the drawings.

First Embodiment

A cell structure and an operation of a memory using a semiconductor element according to a first embodiment of the present invention are described by using FIGS. 1A to 3C. Using FIGS. 1A and 1B, the cell structure of the memory using a semiconductor element according to the first embodiment of the present invention is described. Using FIGS. 2A to 2D, a memory-cell write mechanism and the behavior of carriers are described. Using FIGS. 3A to 3C, a memory-cell erase mechanism and the behavior of carriers are described. Using FIGS. 4 to 5-3E, other examples of the present invention are described.

Figure 1A:
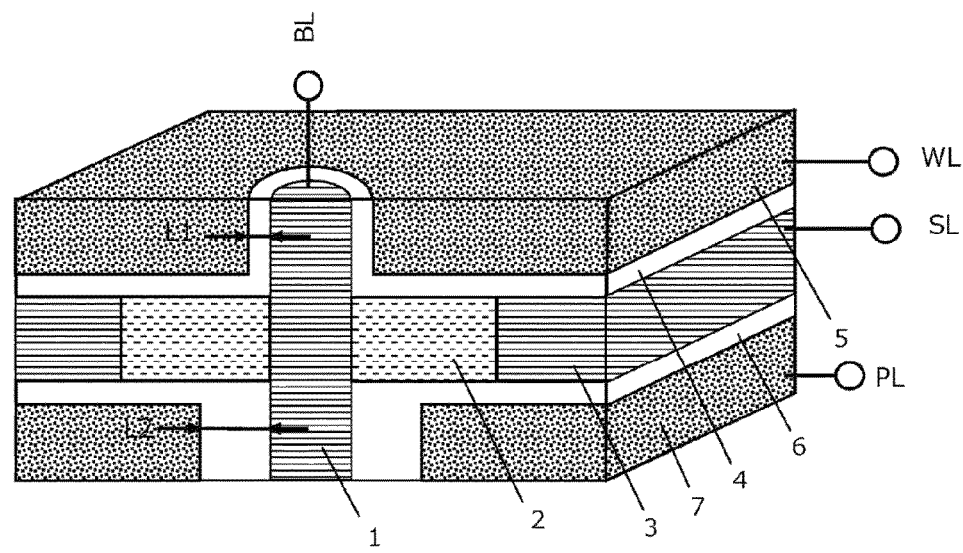
FIG. 1A is a bird's-eye view of a memory device using a semiconductor element according to a first embodiment.

FIG. 1A illustrates the structure of the memory using a semiconductor element according to the first embodiment of the present invention. There is a semiconductor region n+layer 1 (an example of a "first semiconductor region" in the claims) including a high concentration of donor impurities. Note that the semiconductor region including a high concentration of donor impurities is called an "n+layer". There is a p layer 2 (an example of a "second semiconductor region" in the claims) of a p-type conductivity-type that surrounds a part of the n+layer 1, that contacts the n+layer 1, and that includes acceptor impurities. There is a first gate insulating layer 4 (an example of a "first dielectric film" in the claims) that contacts an upper surface of the p layer 2, and a second gate insulating layer 6 (an example of a "second dielectric film" in the claims) that contacts a lower surface of the p layer 2. There is a first gate electrode 5 (an example of a "first gate conductor layer" in the claims) that contacts the first gate insulating layer, and a second gate electrode 7 (an example of a "second gate conductor layer" in the claims) that contacts the second gate insulating layer 6. A shortest distance L2 between the second gate electrode 7 and the n+layer 1 is larger than a shortest distance L1 between the first gate electrode 5 and the n+layer 1. Further, there is a semiconductor n layer 3 (an example of a "third semiconductor region" in the claims) of an n-type conductivity type that contacts the p layer 2, the gate insulating layer 4, and the gate insulating layer 6 and that includes donor impurities.

Further, the n layer 3 is connected to a source line SL that is a first wire conductor layer (an example of a "source line" in the claims), the n+layer 1 is connected to a bit line BL that is a second wire conductor layer (an example of a "bit line" in the claims), the gate conductor layer 5 is connected to a word line WL that is a third wire conductor layer (an example of a "word line" in the claims), and the gate conductor layer 7 is connected to a plate line PL that is a fourth wire conductor layer (an example of a "plate line" in the claims). By manipulating applied voltages to the source line SL, the bit line BL, the plate line PL, and the word line WL, the memory is operated. A specific driving method is described below.

Figure 1B:
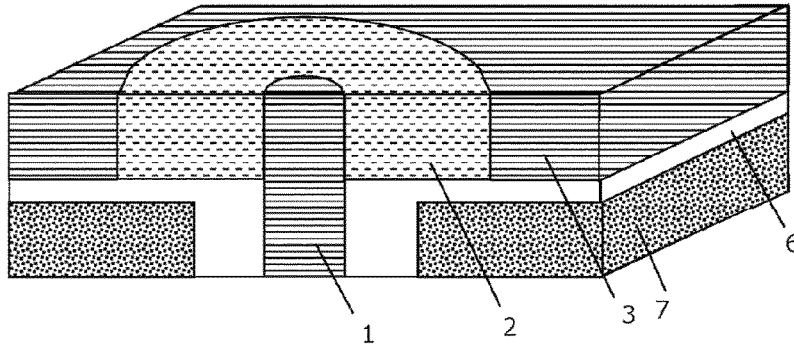
FIG. 1B is a bird's-eye view without a film at an upper portion in FIG. 1A.

FIG. 1B is a bird's-eye view of a memory cell without the gate insulating layer 4 and the gate insulating layer 5 in FIG. 1A.

For the gate insulating layers 4 and 6, any insulating film that is used in an ordinary MOS process, such as a silicon oxide ($SiO_2$) film, a silicon oxynitride (SiON) film, a hafnium silicon oxide ($HfSiO_2$) film, or a laminated film of $SiO_2/SiN$, can also be used. Note that, although in FIGS. 1A and 1B, the gate insulating layers 4 and 6 are shown as having the same film thickness in their entirety, the film thickness of the gate insulating layer 4 that contacts the gate conductor layer 5 may differ depending upon location. Similarly, the film thickness of the gate insulating layer 6 that contacts the gate conductor layer 7 may differ depending upon location.

Although, in FIGS. 1A and 1B, the p layer 2 is a p-type semiconductor, an optimum value of the impurity concentration of the p layer 2 is determined by the quantity of excessive holes that are accumulated in the memory with, for example, the thickness or the volume of the p layer 2, the thickness of the gate insulating layer 4, the thickness of the gate insulating layer 6, the material of the gate conductor layer 5, the material of the gate conductor layer 7, or a voltage to be applied being a parameter. Further, the p layer 2 may have a profile, or may depend upon the material or the thickness of the gate insulating layer 4, the material or the thickness of the gate insulating layer 6, or may depend upon the material of the gate conductor layer 5 or the material of the gate conductor layer 7, and the concentration of the p layer 2 may change in planar view or in a depth direction.

A profile may exist for the impurity concentration of the n+layer 1 or the n layer 3, or the impurity concentration of the n layer 3 may be increased and the n layer 3 may be formed into an n+3 layer. In a direction in which the n+layer 1 or the n layer 3 and the p layer 2 are connected to each other, an LDD (Lightly Doped Drain) region having a donor concentration that is lower than the donor impurity concentration of the n+layer 1 or the n layer 3 may be provided between the p layer 2 and the n+layer 1 or the n layer 3. Alternatively, a metal layer that is connected to a central portion of the n+layer 1 in a perpendicular direction may be provided and the resistance between the n+layer 1 and the bit line BL of each memory cell may be decreased.

As long as the first gate conductor layer 5 changes an electric potential of a part of the memory cell through the gate insulating layer 4, or as long as the second gate conductor layer 7 changes an electric potential of a part of the memory cell through the gate insulating layer 6, the first gate conductor layer 5 or the second gate conductor layer 7 may be made of, for example, a metal, such as W, Pd, Ru, Al, TiN, TaN, or WN, or a metal nitride, or an alloy thereof (including silicide), or may be a laminated structure of, for example, TiN/W/TaN, or may be formed by using a semiconductor doped to a high concentration. Alternatively, the first gate conductor layer 5 and the second gate conductor layer 7 may be made of different materials.

In the case where the n+layer 1 and the n layer 3 are formed as semiconductor region p layers whose majority carriers are holes and that include a high concentration of acceptor impurities, when an n-type semiconductor is used for the p layer 2 and a p-type semiconductor is used for each of the n+layer 1 and the n layer 3, the memory of the present invention in which write carriers are electrons is operated.

Figures 1A, 5:
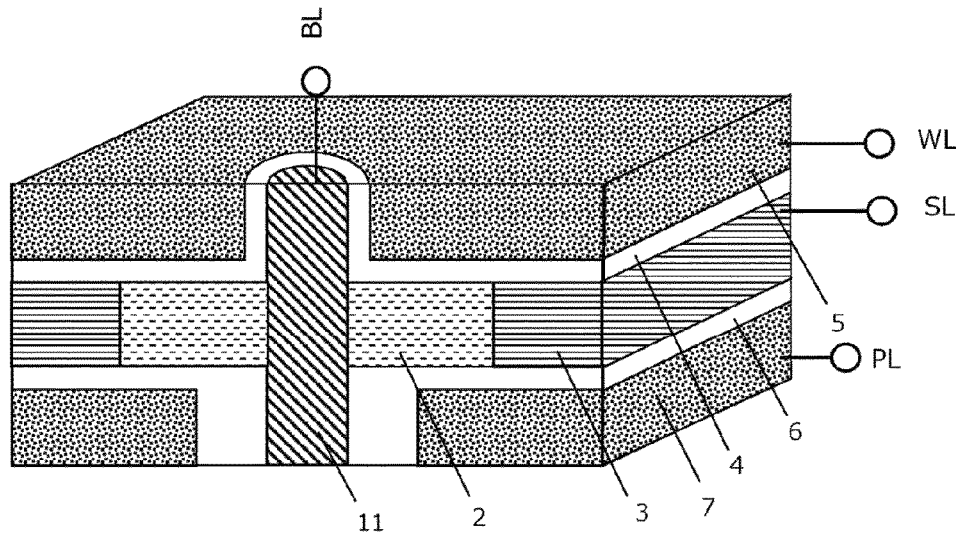
Figures 1B, 5:
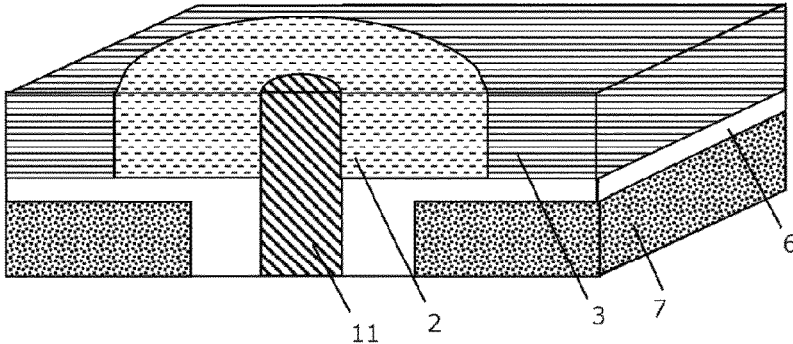
Figures 2C, 5:
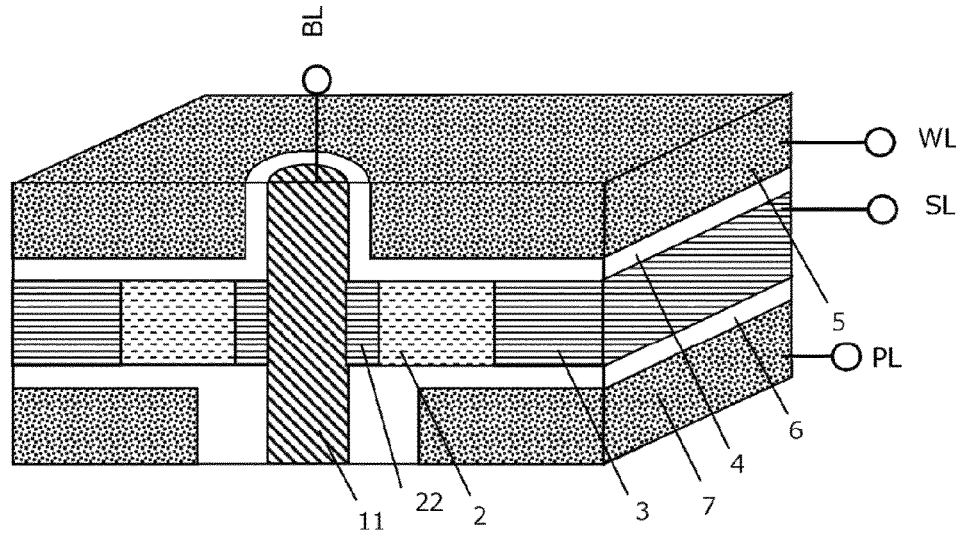

With reference to FIGS. 2A to 2D, carrier behavior, carrier accumulation, and cell current at the time of a write operation of the memory according to the first embodiment of the present invention are described. First, the following case is described, that is, the majority carriers of the n+layer 1 and the n layer 3 are electrons; for example, for the gate conductor layer 5 that is connected to the word line WL and for the gate conductor layer 7 that is connected to the plate line PL, poly Si that includes a high concentration of donor impurities (hereunder, poly Si including a high concentration of donor impurities is called "n+poly") is used; and a p-type semiconductor is used as the p layer 2. As shown in FIG. 2A, MOSFET in the memory cell operates with the n layer 3 that becomes a source, the n+layer 1 that becomes a drain, the gate insulating layer 4, the gate conductor layer 5 that becomes a gate, the p layer 2 that becomes a substrate, the gate insulating layer 6, and the gate conductor layer 7 that becomes a plate electrode being structural elements.

Figures 2D, 5:
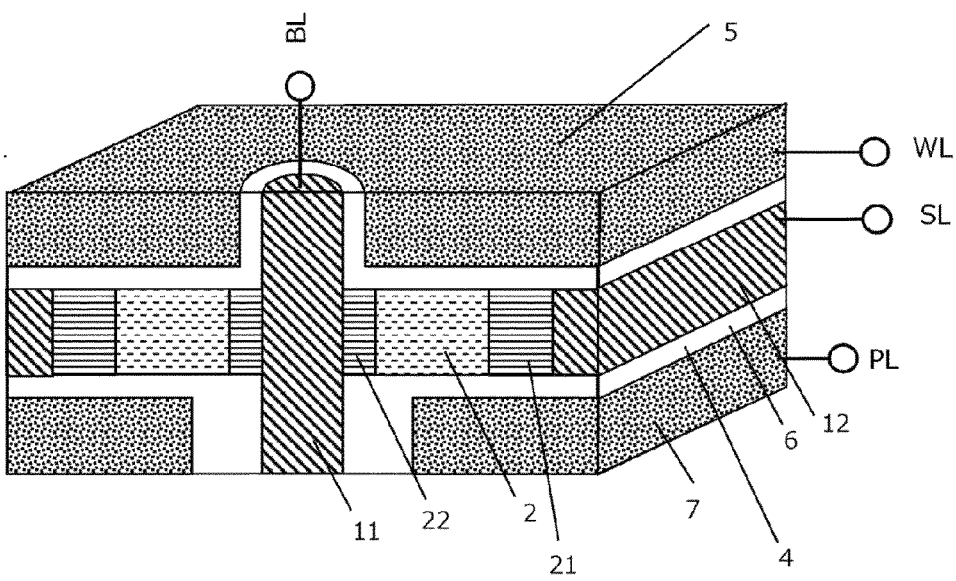

An equivalent circuit of the memory cell of the first embodiment of the present invention is shown in FIG. 2D. Voltages similar to those of an ordinary MOSFET can be applied with the bit line BL being a drain that is the n+layer 1 of the MOSFET, the word line WL being a gate that is the first gate conductor layer 5, and the source line SL being a source that is the n+layer 1. The present invention has two features. One of the features is that a substrate of the MOSFET does not have an electrode to be connected thereto, and the substrate is a floating body. Therefore, in the MOSFET, the p layer 2 operates as the floating body. The other feature is that another gate to which the plate line PL is connected exists with respect to the p layer 2 with an insulating layer being interposed therebetween. Further, since a channel that is formed by changing the voltage of the plate line PL is not connected to the drain, electric current is prevented from flowing in the BL line and the SL line by a channel that is formed in contact with the gate insulating layer 6.

For example, 0 V is input to the n layer 3 to which the source line SL is connected; for example, 1.2 V is input to the n layer 1 to which the bit line BL is connected; and, for example, –1 V is applied to the gate conductor layer 7 to which the plate line PL is connected. Here, a threshold value of the MOSFET in which the gate conductor layer 5 before writing is a gate electrode is, for example, 1.0 V when the voltage of the plate line PL is –1 V. Next, when, for example, 1.5 V is input to the gate conductor layer 5 to which the word line WL is connected, an inversion layer 81 is formed directly below the gate insulating layer 4 that is disposed below the gate conductor layer 5. In this case, an electric current flows between the bit line BL and the source line SL in the MOSFET including the gate conductor layer 5.

As a result, an electric field is increased in the vicinity of the n layer or the inversion layer 81 formed in the MOSFET including the gate conductor layer 5, and an impact ionization phenomenon occurs in this region. Whether the MOSFET operation is a linear-region operation or a saturated-region operation does not matter. By the impact ionization phenomenon, electrons accelerated from the n layer 3 to which the source line SL is connected toward the n layer 1 to which the bit line BL is connected collides with an Si lattice, and, due to kinetic energy thereof, electron-hole pairs are produced. The produced holes spread toward lower hole concentration due to their concentration gradient. As a result, a hole group 83 is accumulated in the p layer 2.

In the example above, the voltage of the plate line PL is –1 V because this contributes to two results, that is, (1) narrowing a depletion layer that is formed at a lower portion of the p layer 2 that contacts the gate insulating layer 4 and widening a portion where holes produced by the impact ionization are easily accumulated, and (2) adjusting by a substrate bias effect a threshold voltage of the MOSFET in the memory cell.

Although, in the example above, n+poly is used for the gate conductor layer 7 in order for a negative voltage to be a bias voltage, a material having a work function that is higher than that of the material of the gate conductor layer 5, that is, n+poly in this example, such as p+poly to which an acceptor-type impurity is introduced, may be used to produce the same effects even if a voltage that is as low as that when an n+poly electrode is used is not applied.

Note that instead of causing the impact ionization phenomenon above to occur, a hole group may be produced by causing Gate Induced Drain Leakage (GIDL) current to flow (see, for example, J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012)).

FIG. 2B illustrates the hole group 83 that exists in the p layer 2 when, directly after writing, the voltage of the plate line PL has become –1 V and the voltages of the word line WL, the source line SL, and the bit line BL have become 0 V. The produced hole group 83 is such that, due to a carrier concentration difference, the holes spread in the p layer 2 from a portion of high concentration to a portion of low concentration by diffusion. Further, since a negative electric potential is applied to the second gate conductor layer 7, the carriers are accumulated to a high concentration near the second gate insulating layer 6. As a result, a threshold voltage of the MOSFET including the gate conductor layer 5 is decreased due to a positive substrate bias effect by the holes that are temporarily accumulated in the p layer 2. In the case of this example, as shown in FIG. 2C, the threshold voltage of the MOSFET including the gate conductor layer 5 to which the word line WL is connected becomes approximately 0.5 V, and, compared to that before the writing, is decreased, as a result of which, when the word line voltage is increased, an electric current flows. This write state is assigned to logic storage data "1".

Ordinarily, in a memory using such a floating body (a typical example being 1TDRAM), when a planar-view area is decreased for higher density, the number of holes that are accumulated in the body is decreased due to the area, as a result of which the operation margin of the memory is narrowed. However, in the memory cell of the present invention, by adjusting the thickness of the p layer 2, the number of holes can be adjusted without changing a planar-view density, which contributes to a stable operation of the memory.

In addition to the example above, when, for example, the voltages that are applied to the bit line BL, the plate line PL, and the word line WL are denoted by a corresponding one of V-BL, V-PL, and V-WL, and, with the voltage of the source line SL being 0 V, a voltage application condition may be, for example, a combination of 1.0 V(V-BL)/−1 V(V-PL)/2.0 V(V-WL), or 1.0 V(V-BL)/−0.5 V(V-PL)/1.2 V(V-WL), or 1.5 V(V-BL)/−1 V(V-PL)/2.0 V(V-WL).

Figures 3A, 3B, 3C:
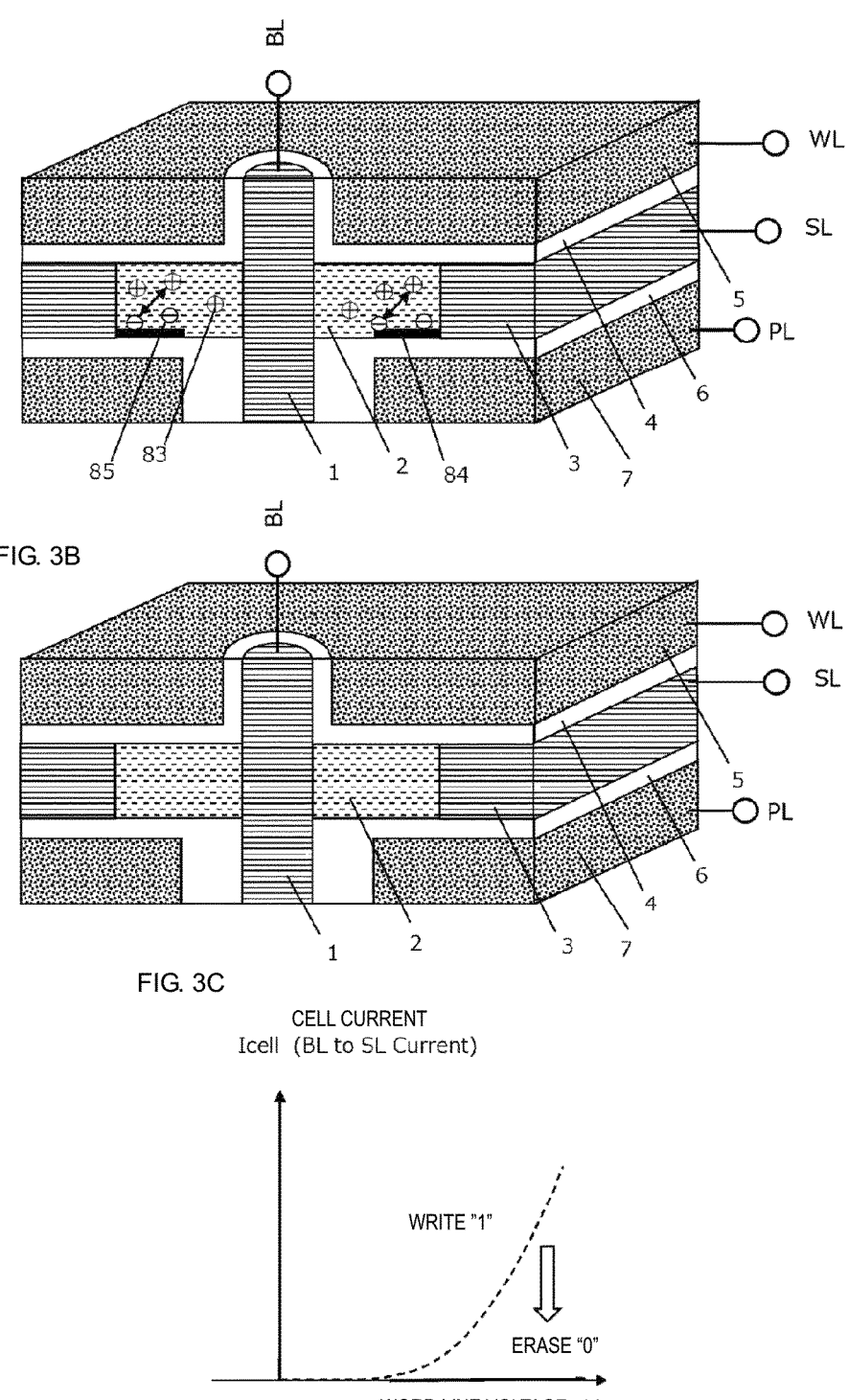
FIGS. 3A, 3B and 3C each illustrate an erase operation of the memory device using a semiconductor element according to the first embodiment.

Next, an erase operation mechanism is described by using FIGS. 3A to 3C. Before an erase operation, that is, at the time of waiting, the voltages of the source line SL, the bit line BL, and the word line WL are 0 V, and the voltage of the plate line PL is −1 V. This is the same as the state shown in FIG. 2B.

As shown in FIG. 3A, at the time of the erase operation, the voltages of the bit line BL and the word line WL are 0 V, and the voltage of the source line SL is 0.5 V. The voltage of the plate line PL is, for example, 2 V. As a result, independently of an initial electric potential value of the p layer 2, at the same time that an electron inversion layer 84 is formed at an interface between the insulating layer 6 and the p layer 2, a depletion layer is formed in the p layer 2 by contacting the inversion layer 84. Due to the formation of the depletion layer, the probability of existence of holes is decreased, and, at a portion in contact with the inversion layer 84 or the n layer 3, electrons that have been lost due to recombination of the holes 83 accumulated in the p layer 2 with electrons 85 are supplied via the n layer 3 from the inversion layer 84 with which contact is made. As a result of the recombination of the holes and the electrons, the hole concentration of the p layer 2 is rapidly decreased with the passage of time. When the erase operation ends, and the voltage of the plate line PL at the time of waiting becomes −1 V, as shown in FIG. 3B, the number of carriers that exist in the floating-body p layer 2 becomes very small, and the threshold voltage of the MOSFET becomes higher than that when "1" is written. For example, the threshold value of the MOSFET after the erase operation becomes 1.2 V, and becomes higher than an initial threshold value of 1.0 V.

Therefore, as shown in FIG. 3C, even if a voltage is applied to the MOSFET including the gate conductor layer 5 to which the word line WL is connected, almost no electric current flows in the MOSFET and the MOSFET is brought into an erase state. This differs considerably from 1TDRAM in which, even in a "0" state, a cell current of approximately 1 to 10% of an on current flows therein (see, for example, T. Ohsawasa, K. Fujita, T. Higashi, Y. Iwata, T. Kajiyama, Y. Asano, and K. Sunouchi, "Memory Design Using a One-Transistor Gain Cell on SOI," IEEE Journal of Solid State Circuits, Vol. 37, No. 11, pp. 1510-1522 (2002)). This state corresponds to memory logic storage data "0". In this way, in this memory cell, there is a large difference between the cell current in the data "1" state and the cell current in the data "0" state, as a result of which a read margin of the memory is large. According to the structure of the present invention, compared to the time of writing or the time of waiting, since the opportunity of recombining the electrons and the holes is increased in correspondence with the area of the inversion layer, the erase efficiency is increased.

As a data erase method other than the example given above, it is possible to erase data by applying a positive voltage to the bit line BL and setting the voltage of the source line SL to 0 V. In this case, it is possible to erase data as a result of recombination of the holes existing in the p layer 2 and the electrons that flow due to an electric field toward the bit line from the source line. Alternatively, is possible to erase data even if the voltages of both the source line SL and the bit line BL are 0 V.

Therefore, when the voltages that are applied to the bit line BL, the plate line PL, the word line WL, and the source line SL are denoted by a corresponding one of V-BL, V-PL, V-WL, and V-SL, a voltage application condition may be, for example, a combination of 0 V(V-BL)/2 V(W-PL)/−1 V(V-WL)/0.5 V(V-SL), or 0.5 V(V-BL)/2 V(V-PL)/0 V(V-WL)/0 V(V-SL), or 1 V(V-BL)/1.5 V(V-PL)/0 V(V-WL)/0 V(V-SL), or 0 V(V-BL)/1.5 V(V-PL)/1.5 V(V-WL)/0 V(V-SL), or 0 V(V-BL)/2 V(V-PL)/0 V(V-WL)/0 V(V-SL). However, the condition of the voltages that are applied to the bit line BL, the source line SL, the word line WL, and the plate line PL is one example for performing a memory erase operation, and may correspond to another operating condition that allows a memory erase operation to be performed. However, the voltage of either one of the bit line BL and the source line SL must be 0 V, and the positive electric potentials of the two electrodes will not be positive electric potentials at the same time.

At the time of erasing, the n+layer 1 is electrically isolated from the inversion layer 84 that is formed by contacting the gate insulating layer 6. Therefore, at the time of the memory erase operation, an electric current does not flow between the n+layer 1 and the inversion layer 84 formed between the p layer 2 and the gate insulating layer 6. Therefore, at the time of erasing, almost no electric current flows in the cell, and this is useful for lower power consumption at the time of erasing. In US 2023/0077140 A1, erasing is performed by setting the electric potentials of a bit line, a source line, and an erase gate to positive electric potentials all at once and coupling the potential of a floating body with a voltage that is sufficiently high for a direction at a PN junction to be a forward direction. As a result, the erase operation is performed by withdrawing the holes from the floating body and decreasing the electric potential thereof. However, in the present invention, such an operation does not exist.

According to the first embodiment of the present invention, when, at the time of erasing, a positive voltage is applied to the plate line PL, the memory erasing can be performed, as a result of which the gate conductor layer 7 can be shared by a plurality of cells and the pieces of information on these cells can be erased all at once.

Figure 4:
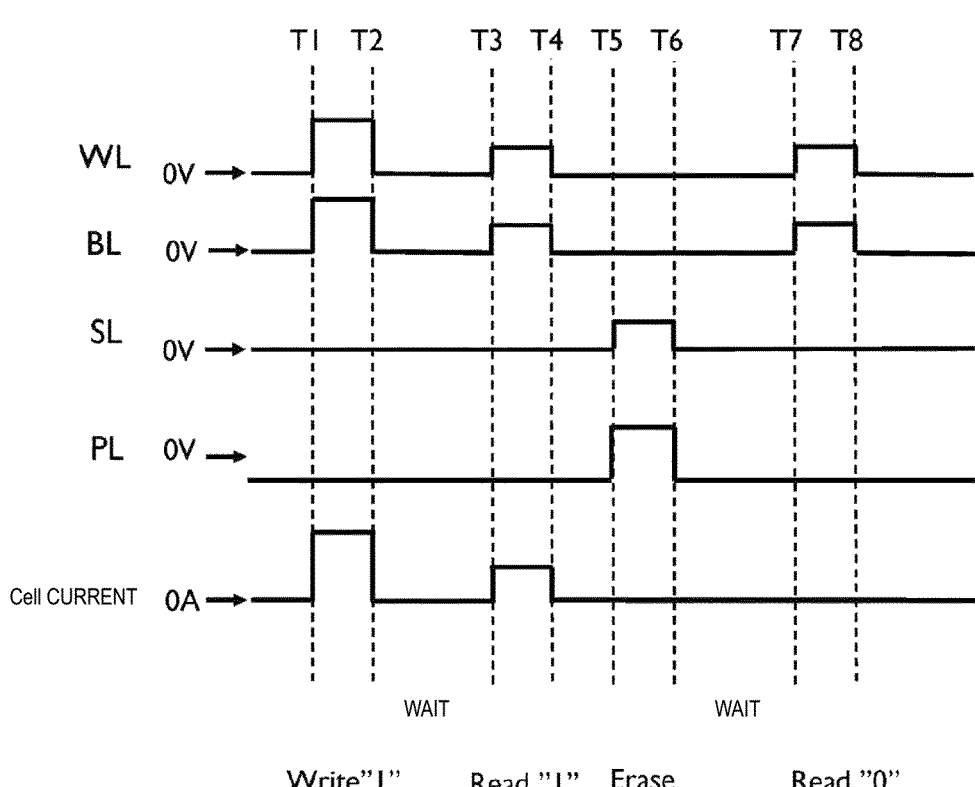
FIG. 4 illustrates a memory state and signals that are input to respective terminals when the memory device using a semiconductor element according to the first embodiment is to be operated.

FIG. 4 illustrates typical inputs of signals to the bit line BL, the plate line PL, the word line WL, and the source line SL, and cell currents that flow in a memory cell at the time of writing, erasing, and waiting. Before T1, the voltages of all signals except that of the plate line are 0, and the voltage of the plate line is a negative voltage. At the time of writing and at T1, the voltages of the bit line BL and the word line WL are positive voltages, the voltage of the plate line PL is a negative voltage, and the voltage of the source line SL is 0 V. At T2, the writing ends, and the time until T3 is the time of waiting. Thereafter, at the time of reading, positive voltages are applied to the bit line BL and the word line WL, and an electric current flows between the bit line BL and the source line SL, as a result of which "1" is recognized. Thereafter, at T5, a positive electric potential is applied to the source line SL, and the voltage applied to the plate line PL is changed from the negative voltage to a positive voltage, as a result of which the erase operation is performed. The time from T6 to T7 is the time of waiting, and, from T7 to T8, voltages that are the same as those when "1"

is read is applied. However, an electric current does not flow between the bit line BL and the source line SL, and "0" is read.

FIGS. 5-1A and 5-1B each illustrate an application example of the first embodiment. Although, FIGS. 1A and 1B each illustrate a case in which, for the bit line BL of the memory, a semiconductor layer into which a high concentration of impurities has been introduced is used, a metal layer 11 is used for the bit line BL, the p layer 2 is formed around a part of the metal layer 11 (an example of a "first metal layer" in the claims), and the other structural features are the same as those in FIGS. 1A and 1B. FIG. 5-1B is a bird's-eye view of the memory cell without the gate conductor layer 7 and the gate insulating layer 5 in FIG. 5-1A.

Figures 3E, 5:
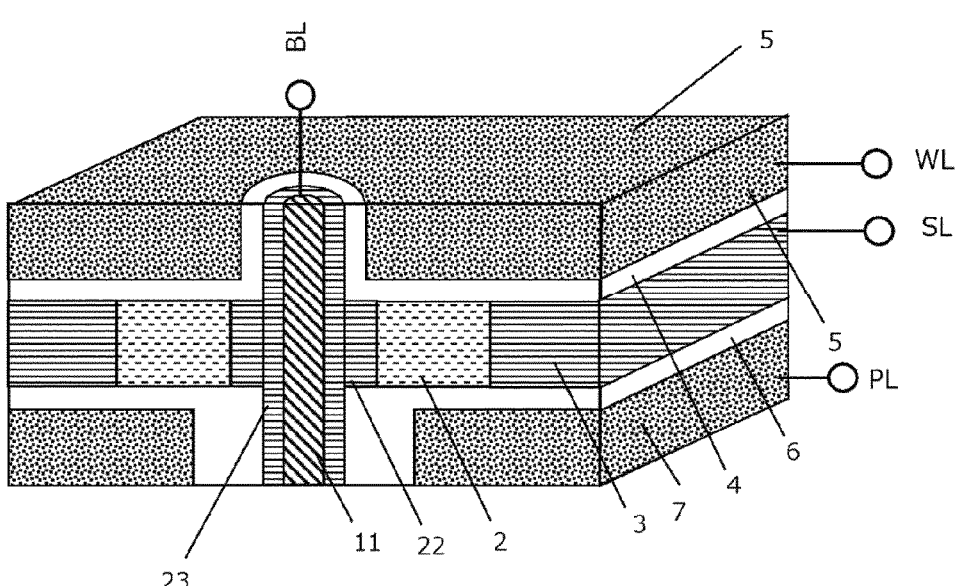

FIG. 5-2C illustrates another application example of the first embodiment. Although, in FIG. 5-1A, the p layer 2 directly contacts the metal layer 11 of the memory, here, FIG. 5-2C illustrates an example in which an n+layer 22 is formed between the metal layer 11 and the p layer. The other structural features are the same as those in FIGS. 1A and 1B. In addition to the structural portions in FIG. 5-2C, in FIG. 5-2D, an n+layer 21 is formed on a source side, and a metal layer 12 is further formed along an outer periphery thereof. The other structural features are the same as those in FIGS. 1A and 1B. Both of these examples are those in which a lower resistance material is used for a part of the bit line and a part of the source line. For achieving the same purpose, as shown in FIG. 5-3E, there is a method of using the metal layer 11 in the center of the bit line, and surrounding the vicinity thereof with an n+layer 23.

The first embodiment of the present invention has the following features.

Feature 1

Although the memory according to the first embodiment of the present invention includes structural elements constituted by four terminals, it is possible to, by operating two gates, make large the difference between an electric current when an access transistor of the memory is brought into an on state and an electric current when the access transistor of the memory is brought into an off state. Therefore, it is possible to increase a read margin of the memory.

Feature 2

In the first embodiment of the present invention, by adjusting the thickness of the p layer 2, the number of holes that accumulate in the floating body can be adjusted without changing a planar-view memory density. Therefore, it is possible to provide a wide range of memory operations.

Feature 3

In the first embodiment of the present invention, the cell current that flows at the time of erasing is determined only by the electric current due to the recombination of electrons and holes. Therefore, it is possible to realize lower power consumption for the memory erase operation.

Feature 4

In the memory according to the first embodiment of the present invention, it is possible to share the gate conductor layer 7 and to, even when a plurality of memory cells are disposed, perform erasing of the plurality of cells at the same time by one operation.

Second Embodiment

Figures 1A, 1B, 6:
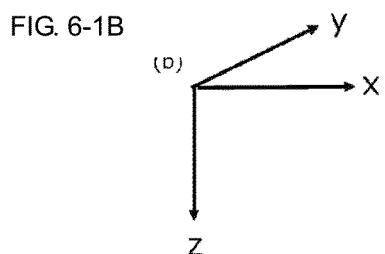
Figures 2C, 6:
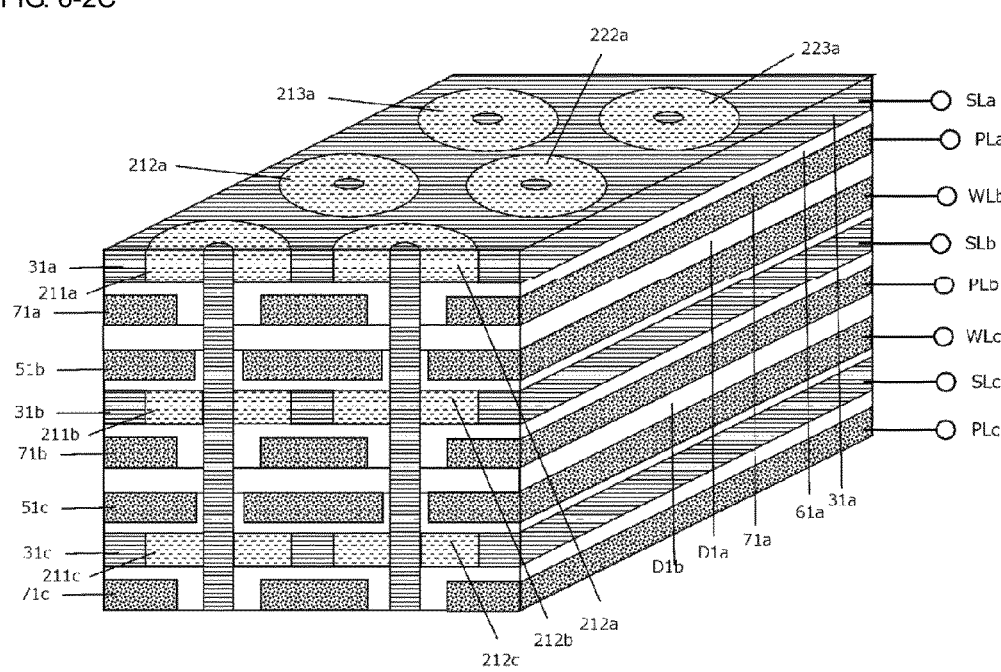

FIGS. 6-1A and 6-1B and FIG. 6-2C are used for illustrating a cell arrangement of the memory device using a semiconductor element according to the first embodiment. In FIG. 6-1A, one cell unit that is disposed in a first row, a first column, and an a layer (an example of a "memory cell" in the claims) is shown by a dotted line. As shown in FIG. 6-1A, the rows and columns are denoted by numbers, such as 1, 2, and 3, in the direction of an arrow, and the layers are denoted by lower case letters of the alphabet, such as a, b, and c, from an upper side. In the example in FIG. 6-1A, memory cells, each being the memory cell in FIGS. 1A and 1B, are arranged so as to be isolated from each other in a perpendicular direction (hereafter, a z direction indicated as a "vertical direction" or a "layer"), and are further arranged in a horizontal direction (hereafter, an x direction indicated as a "row direction" or a "row", and a y direction indicated as a "column direction" or a "column"). FIG. 6-1A illustrates an example of the memory device including a total of 18 memory cells, that is, three layers of memory cells of two rows and three columns. In the actual memory device, it is possible to dispose a larger number of memory cells than 18 memory cells. The layers are isolated by an insulating layer D1*a* (an example of a "first insulating layer" of the claims) or an insulating layer D1*b*.

One memory cell surrounded by the dotted line includes an n+layer 111*a*, a p layer 211*a*, an n layer 31*a*, a gate insulating layer 41*a*, a gate conductor layer 51*a*, a gate insulating layer 61*a*, and a gate conductor layer 71*a*. The n+layer 111*a* is connected to a bit line BL11, the gate conductor layer 51*a* is connected to a word line WLa, the gate conductor layer 71*a* is connected to a plate line PLa, and a source line SLa is connected to the n layer 31*a*, and signals are input thereto. Of the layers, the n layer 31*a*, and the gate conductor layers 51*a* and 71*a* are shared in the a layer in the z direction, and the n+layer 111*a* is shared by the cells from the a layer to the c layer in the z direction. FIG. 6-2C illustrates a memory cell array without the gate conductor layer 51*a* and the gate insulating layer 41*a*.

When a write operation is performed on the memory cell surrounded by the dotted line as a target, the bit line BL11 of a layer where the memory cell exists is selected, a positive electric potential is applied, the word line WLa is selected, and a positive electric potential is applied. At this time, the voltages of all source lines SLa to SLc are 0 V, and the voltages of plate lines PLa to PLc are −1 V. At the time of erasing, when the voltage of the plate line PLa is 2 V, the voltage of the source line SLa is 0.5 V, and the voltages of all word lines WLa to WLc and the voltages of all bit lines BLa to BLc are 0 V, it is possible to perform erasing on the cells in the a layer all at once. Naturally, when the plate lines or the source lines are isolated from each other so as to intersect each other in the perpendicular direction, an erase operation can also be randomly performed.

Figure 7:
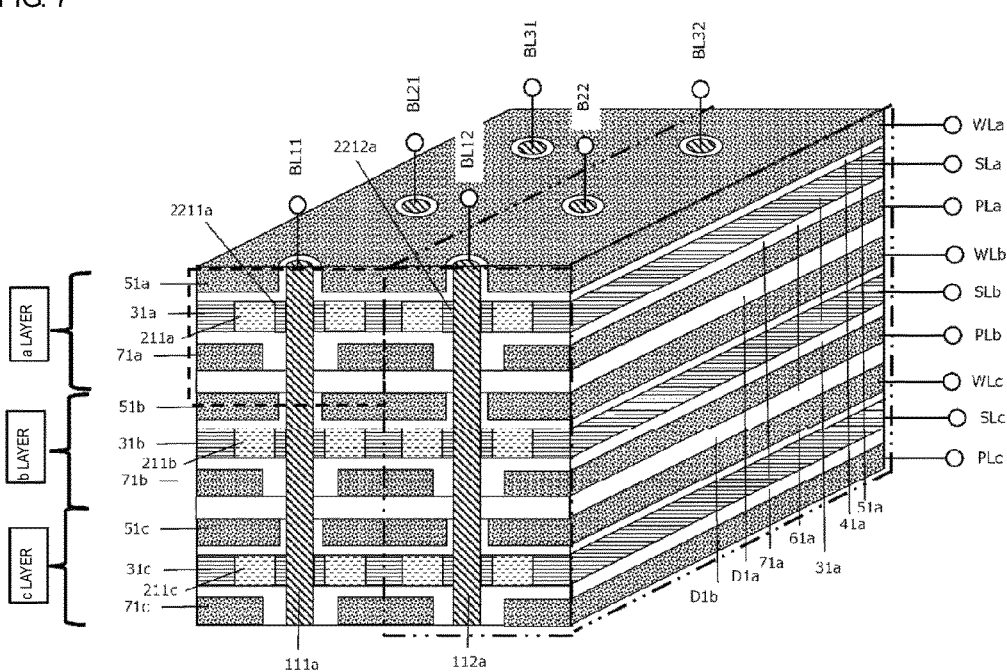
FIG. 7 illustrates an additional example of a memory device using a semiconductor element according to the second embodiment.

FIG. 7 illustrates an example of a cell array arrangement using the memory cell in FIG. 5-2C. If attention is focused on a cell surrounded by a dotted line, a metal layer is used for an n+layer 111*a* to which a bit line is connected, the cell array structure is the same as the cell array structure in FIG. 6-1A except that the n+layer 111*a* is surrounded by an n+layer 2211*a*, and the functions are also the same. Note that the dotted line denotes one memory cell unit, and an alternate long and short dashes line denotes a block in which nine memory cells, that is, three layers of memory cells of one row and three columns are disposed.

Figure 8:
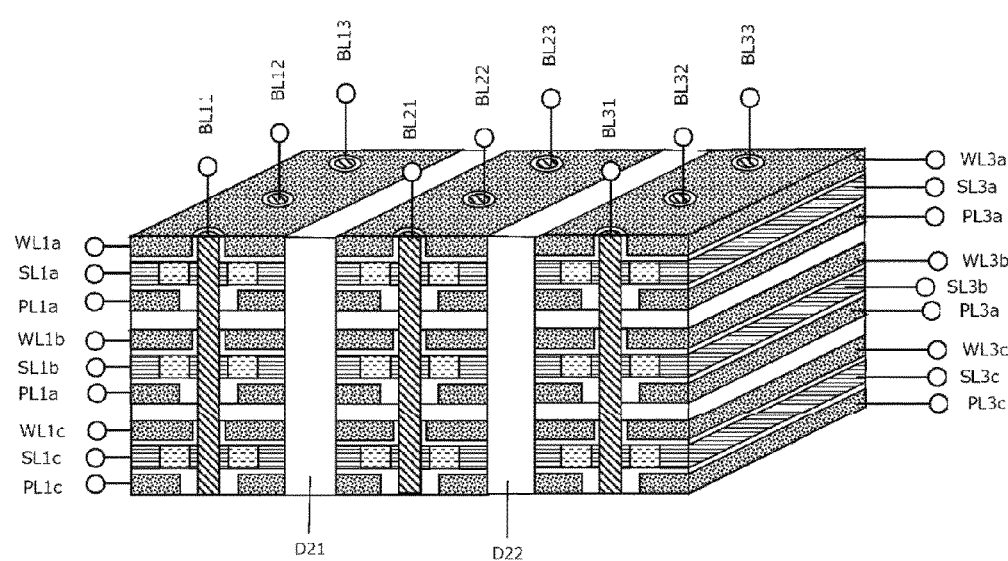
FIG. 8 illustrates an additional example of the memory device using a semiconductor element according to the second embodiment.

FIG. 8 illustrates an example in which the block defined in FIG. 7 is disposed by being divided by dielectric bodies D21 and D22 (an example of a "second insulating layer" in the claims). Although, in the case of this example, a word line, a source line, and a plate line are shared by cells in the X direction, word lines, source lines, and plate lines are individually provided in the Y direction. Therefore, in this figure, word lines WLa to WLc (WLb is not indicated), source lines SLa to SLc (SLb is not indicated), and plate lines PLa to PLC (PLb is not indicated) are isolated from each other, are each selected at the time of a memory operation, and voltages are independently applied thereto.

Figure 9:
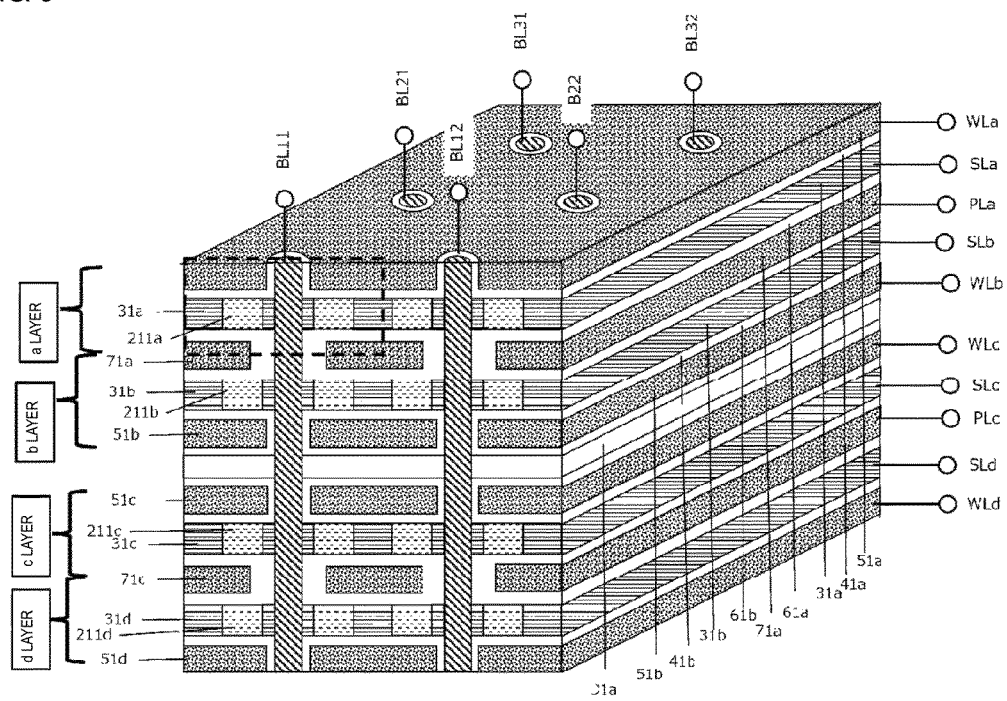
FIG. 9 illustrates an additional example of the memory device using a semiconductor element according to the second embodiment.

FIG. 9 illustrates an example of a memory cell arrangement for realizing a memory device having an even higher density according to the second embodiment of the present invention. FIG. 9 illustrates an example of a cell arrangement when an adjacent plate electrode in the z direction is shared. A portion surrounded by a dotted line denotes one cell, and the one cell shares a plate electrode 71*a* with a cell existing directly below the one cell. This figure shows all four layers in the z direction from an a layer to a d layer. In this case, when a positive voltage is applied to a source line used for performing an erase operation, erasing can be performed on the layer thereof. It is possible to perform an erase operation at the same time on cells in two layers, that is, the a layer and the b layer that are adjacent to the plate electrode. Note that although the structural elements from the a layer to the b layer have been individually labeled one by one, only some of the structural elements from the c layer to the d layer have been labeled to avoid confusion.

As long as a material that can hold the cell array, such as a semiconductor, an insulator, or a metal layer that can support the cell array disposed in FIG. 6-1A to FIG. 9, is used, the memory cell array can be laid out and disposed in a perpendicular direction or a horizontal direction on any substrate.

The second embodiment of the present invention has the following features.

Feature 1

The memory according to the second embodiment of the present invention is such that, by two-dimensionally disposing one memory cell proposed in the first embodiment and isolating memory cells by a corresponding one of the dielectric bodies D1*a*, D1*b*, D21 and D22, the memory cells are three-dimensionally laminated in the vertical direction to make it possible to realize a high-density cell array.

Feature 2

The memory cell array according to the second embodiment of the present invention is such that, by using the dielectric bodies D1*a*, D1*b*, D21, and D22, a word line, a plate line, and a source line shared by a plurality of memory cells can be freely set.

Feature 3

The memory cell array according to the second embodiment of the present invention is such that, by applying a voltage to a selected one of the word line, the plate line, the source line, and the bit line, it is possible to perform writing, reading, or erasing on a desired cell.

Third Embodiment

Figures 1A, 1B, 10:
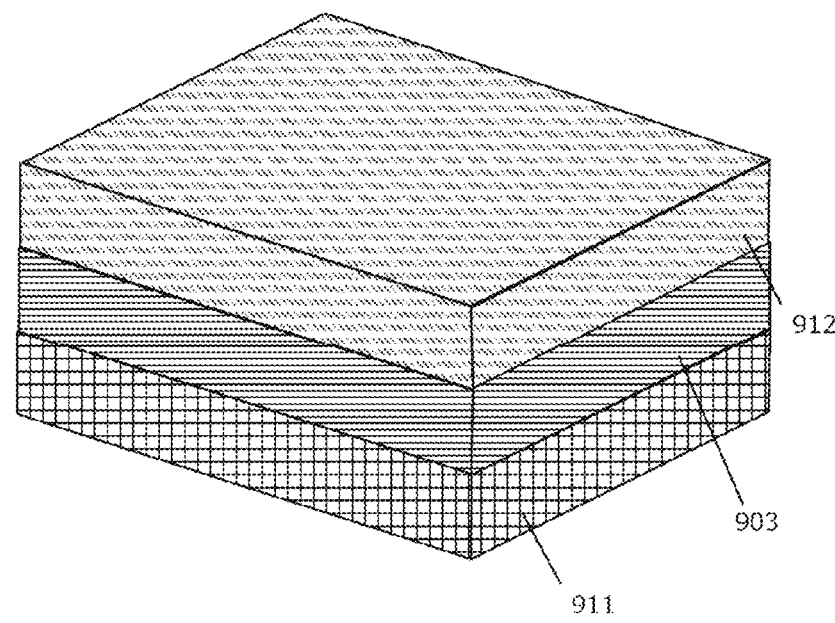
Figures 2C, 10:
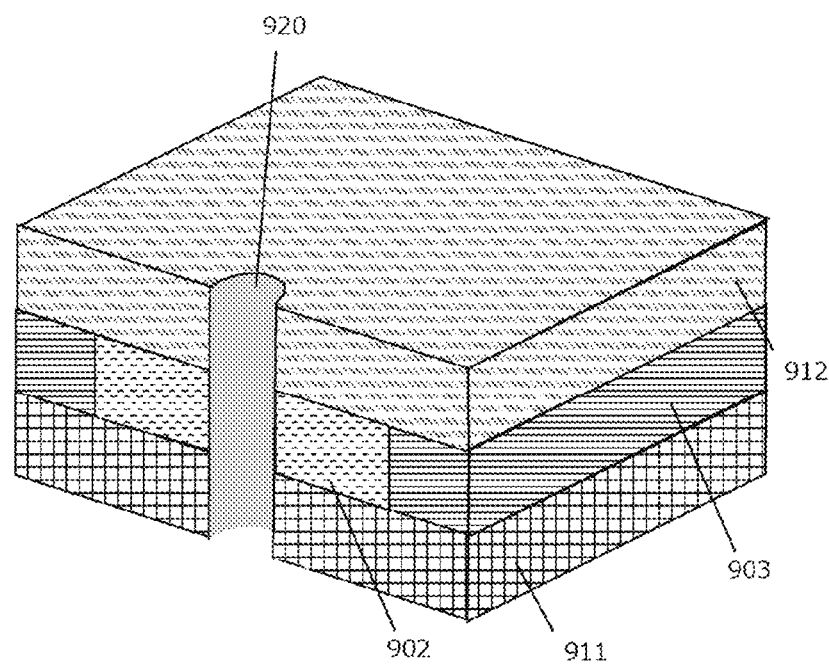
Figures 2D, 10:
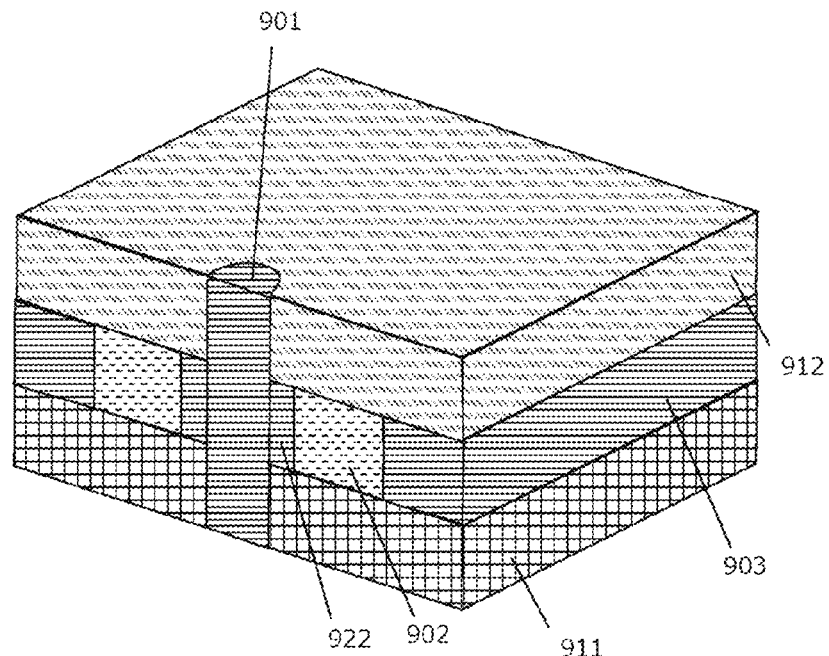
Figures 3E, 10:
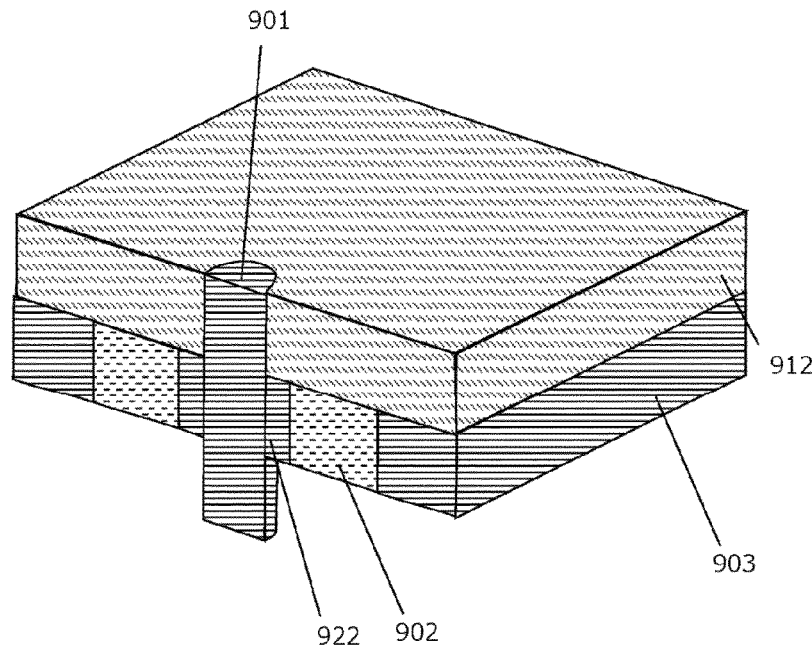
Figures 3F, 10:
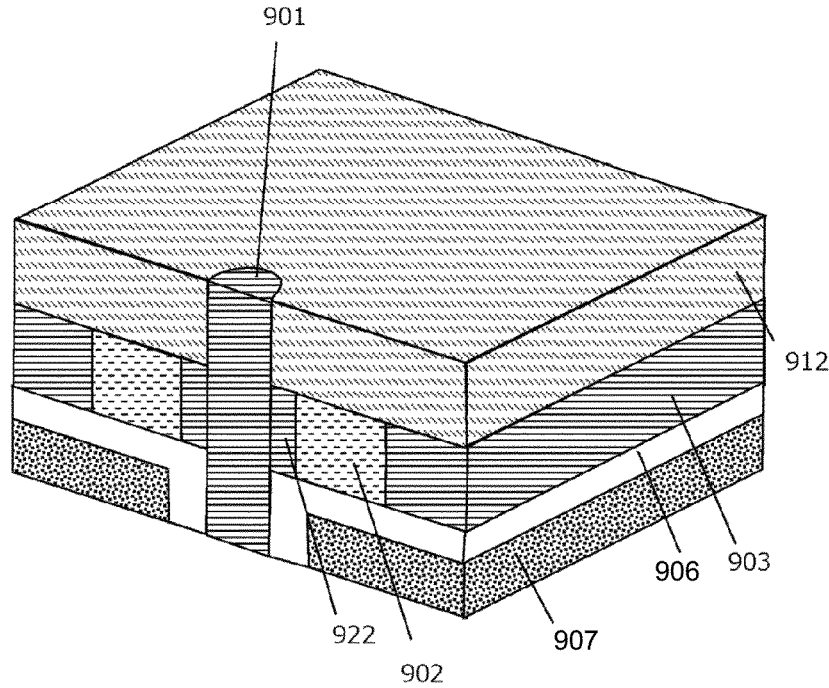
Figures 4G, 10:
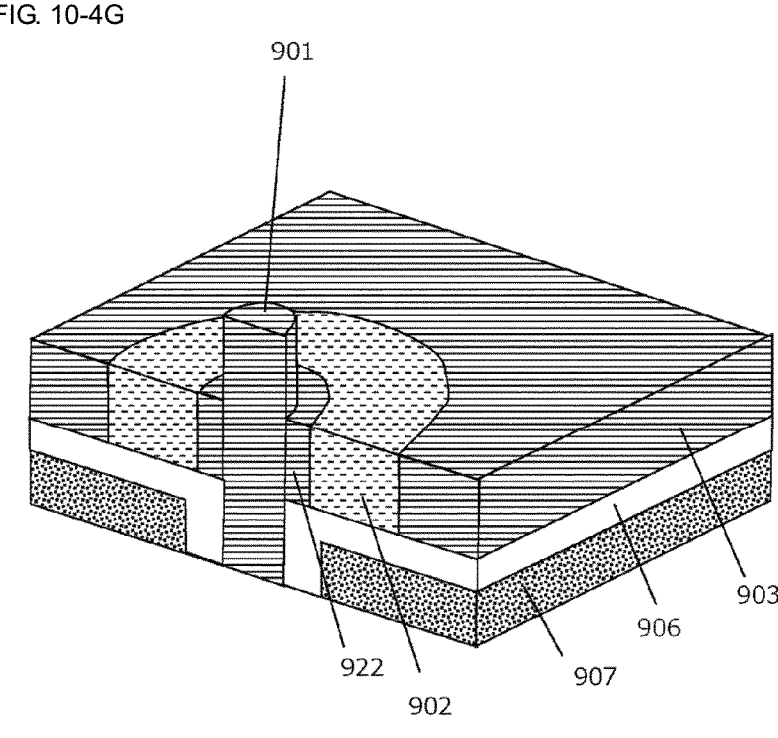
Figures 4H, 10:
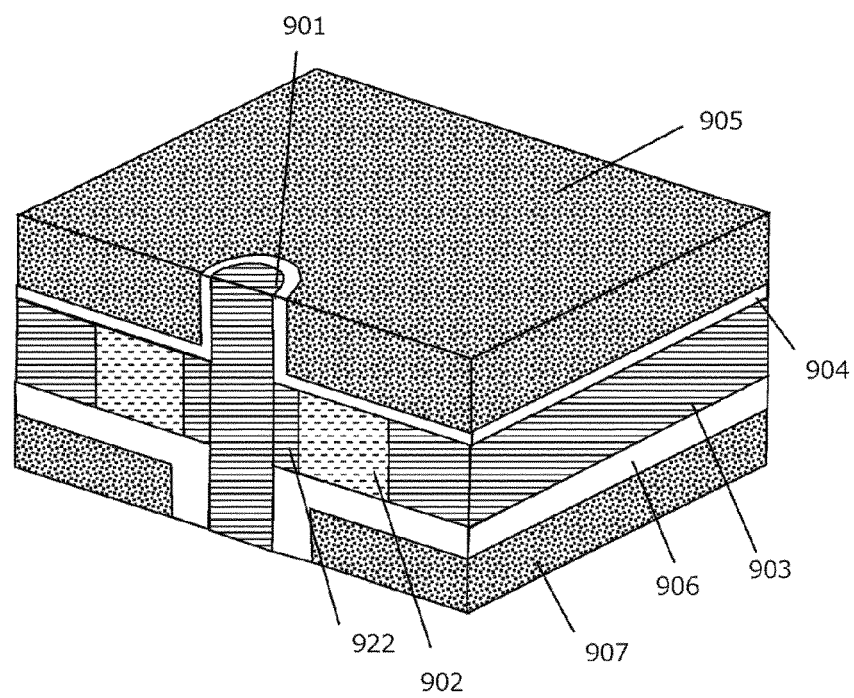

FIGS. 10-1A to 10-4H illustrate a simple process step according a third embodiment used for forming the memory cell structure shown in FIGS. 1A and 1B. FIGS. 10-1A to 10-4H, in which attention is focused on one memory cell, illustrate only a semiconductor layer 903 and two sacrificial layers, that is, a sacrificial layer 911 (a "first sacrificial layer" in the claims) and a sacrificial layer 912 (a "second sacrificial layer" in the claims). However, in order to realize a structure as that described in the second embodiment, any number of semiconductor layers 903 and any number of sacrificial layers 911 and 912 can be alternately deposited to form a memory having a stack structure.

FIG. 10-1A illustrates a state in which the semiconductor layer 903 that includes an n-type conductor and are made of, for example, polysilicon or silicon, and sacrificial layers 911 and 912 that are made of an oxide or a nitride are alternately deposited and a laminated structure is formed. For example, in this example, a silicon oxide film is used for the sacrificial layer 911, and a silicon nitride film is used for the sacrificial layers 912. These layers are formed by, for example, chemical vapor deposition (CVD), low pressure chemical vapor deposition (LPCVD), plasma enhanced chemical vapor deposition (PECVD), atomic layer deposition (ALD), or plasma enhanced atomic layer deposition (PE-ALD), or any other suitable deposition process, such as physical vapor deposition (PVD), or any other suitable process.

Thereafter, as shown in FIG. 10-1B, by using a lithography step and by using an anisotropic etching process to etch laminated layers, a perpendicular bit line hole (or an opening portion) 920 is formed.

FIG. 10-2C illustrates a method in which a plasma doping (PLAD) process or a vapor-phase doping process is applied throughout the perpendicular bit line hole 920 and in which a dopant of a type opposite to that used in the semiconductor layer 903 is used for doping, and a p layer 902 is formed. For example, when the semiconductor layer 903 includes an N-type dopant, such as phosphorus, the plasma doping process is performed to form the p layer 902 by using a P-type dopant, such as boron.

FIG. 10-2D illustrates a state in which the perpendicular bit line hole 920 is filled with a semiconductor material, such as polysilicon, doped with an n-type impurity to a high concentration, and a semiconductor layer 901 is formed. By using an in-situ doping process, the semiconductor layer 901 may be deposited by any suitable deposition process, such as chemical vapor deposition (CVD), physical vapor deposition (PVD), plasma enhanced atomic layer deposition (PE-ALD), atomic layer deposition (ALD), low pressure chemical vapor deposition (LPCVD), plasma enhanced chemical vapor deposition (PECVD), or any other suitable process. When the memory cell is an NMOS cell, an N-type dopant, such as phosphine ($PH_3$) or arsine ($AsH_3$), is added while depositing the semiconductor layer 901. When the memory cell is a PMOS cell, a P-type dopant, such as diborane ($B_2H_6$), is added while depositing the semiconductor layer 901.

This shows that, during the actual process, a dopant leaks to the semiconductor layer 902 from the semiconductor layer 901 and an n-type semiconductor layer 922 is formed. Although this is a point that differs slightly from FIGS. 1A and 1B, there is essentially no difference.

FIG. 10-3E illustrates how the sacrificial layer 911 is selectively removed by using an isotropic etching process, such as wet etching. Since the sacrificial layer 911 is a silicon oxide film, the sacrificial layer 911 can be selectively etched by using fluoric acid (HF), ammonium fluoride acid ($NH_4F$), or fluoric acid and another mixture. As a result, the semiconductor layers 901, 902, 903, and 922 are exposed.

In FIG. 10-3F, a gate insulating layer 906 that is formed from a dielectric, such as a silicon oxide ($SiO_2$) film, a silicon nitride film (SiN), hafnium oxide ($HfO_2$), or titanium oxide ($TiO_2$), or that is formed from a lamination thereof is formed on the exposed surfaces of the semiconductor layers 901, 902, 903, and 922 previously covered by the sacrificial layer 911. Here, an important point is that the gate insulating layer 904 that contacts the n+layer 901 is thicker than the semiconductor layer 922. FIG. 10-3F illustrates a state in which, thereafter, for example, n+poly silicon doped to a high concentration, or tungsten (W), tantalum (Ta), or titanium (Ti), or a metal nitride, such as WN, TaN, or TiN, or a silicide, is brought into contact with the gate insulating layer 906 and is formed as a gate insulating layer 907.

FIG. 10-4G illustrates a state in which, as in FIG. 10-3E, an isotropic etching process, such as plasma etching or wet etching, is used and the sacrificial layer 912 is selectively removed. As a result, the semiconductor layers 901, 902, 903 and 922 are exposed. Subsequently, as shown in FIG. 10-4H, by performing a process that is exactly the same as the process in FIG. 10-3F, a gate insulating layer 904 is formed, and a gate conductor layer 905 is formed. However, here, an important point is that the gate insulating layer 904 that contacts the n+layer 901 is thinner than the semiconductor layer 922. As a result, a shortest distance between the gate conductor layer 907 and the semiconductor layer 901 is larger than a shortest distance between the gate conductor layer 905 and the semiconductor layer 901, and the structure proposed in the first embodiment can be realized.

In this example, as two sacrificial layers, a silicon oxide film and a silicon nitride film are given as examples. However, any types of films, including silicon films, may be selected as long as the type of etching is selective.

A method in which, in forming a semiconductor layer 903, first, a laminated structure of, for example, crystalline silicon (Si), crystalline silicon germanium (SiGe), and an alumina film ($Al_2O_3$) is formed; among them, SiGe and $Al_2O_3$ used as sacrificial layers are selectively removed in order; and a gate insulating layer and a gate conductor are formed can also be applied (see, for example, N. Louber et al., "Stacked Nanosheet Gate-All-Around Transistor to Enable Scaling Beyond FinFET," IEE Symposium on VLSI Technology Digest of Technical Papers, pp. T230-T231 (2017)).

Figures 1A, 11:
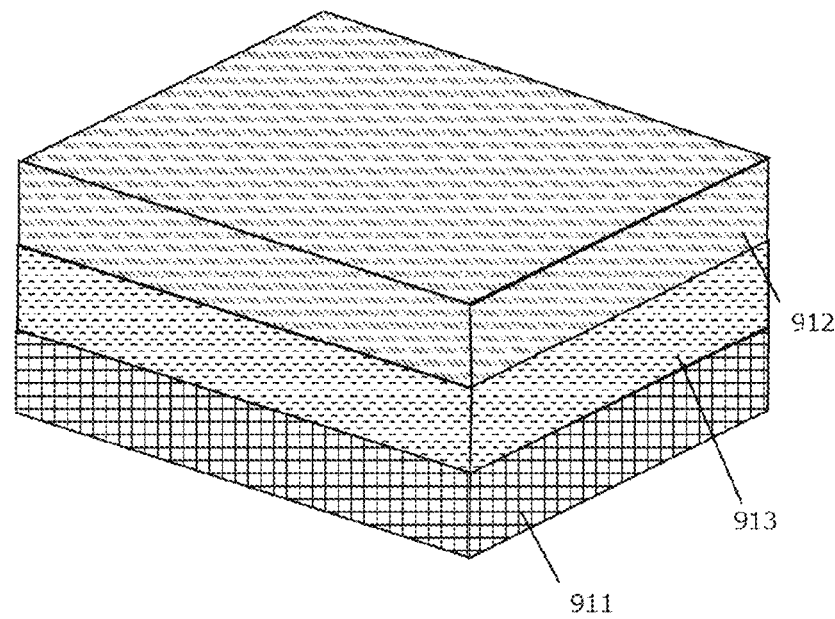
Figures 1B, 11:
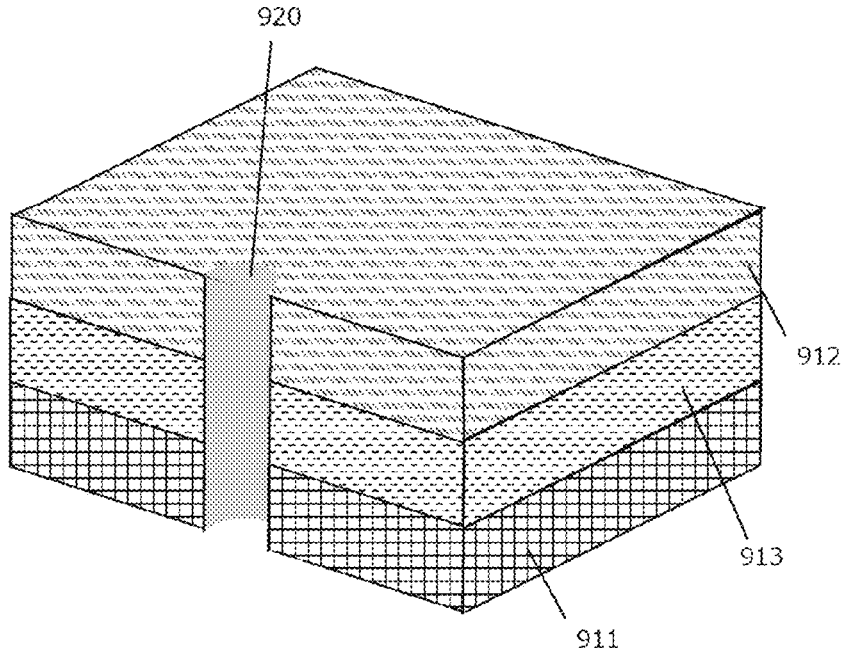
Figures 3E, 11:
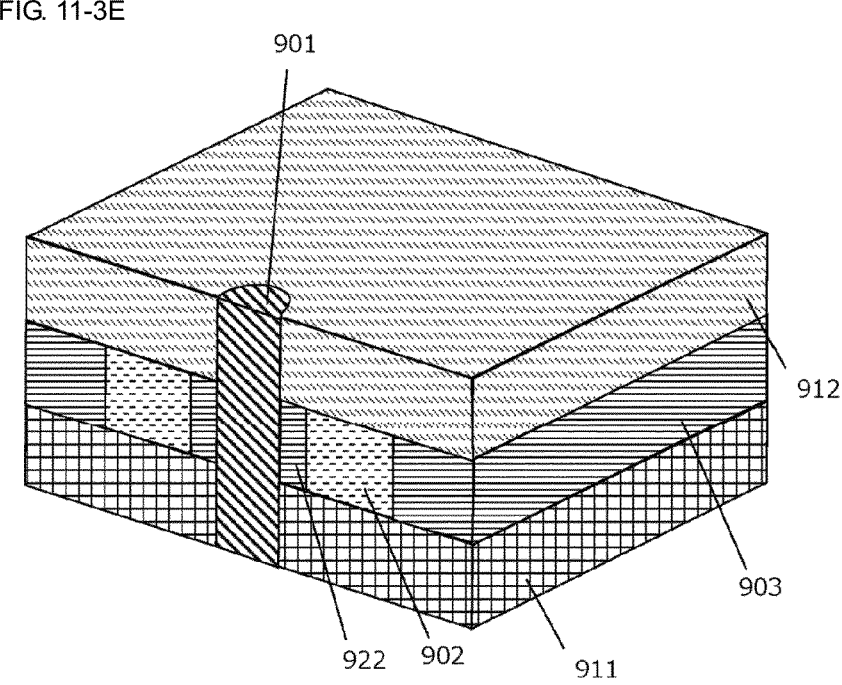
Figures 3F, 11:
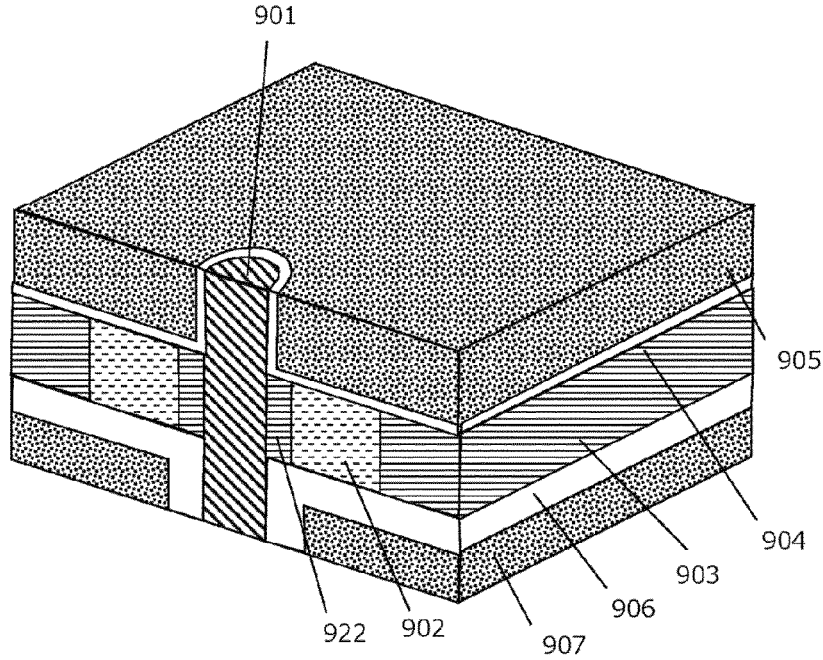

FIGS. 11-1A to 11-3F each illustrate an application example of the third embodiment. Here, instead of the semiconductor layer 903 in FIG. 10-1A, a sacrificial layer 913 is deposited together with sacrificial layers 911 and 912, and a laminated structure is formed. Thereafter, as shown in FIG. 11-1B, as in FIG. 10-1B, a perpendicular bit line hole (or an opening portion) 920 is formed. Thereafter, as shown in FIG. 11-2C, the perpendicular bit line hole 920 is filled with a metal layer 911. For example, a method in which the perpendicular bit line hole 920 is filled with a high-melting-point metal, such as tungsten (W), by a CVD method is shown. By using the metal layer 911 for the bit line, a lower bit-line resistance is realized.

Thereafter, as shown in FIG. 11-2D, with the sacrificial layers 911 and 912 remaining as they are, the sacrificial layer 913 is selectively removed. Next, by further using an In-situ doping technology for a metal-assisted epitaxial technology (see, for example, Hidenori Miyagawa, Haruka Kusai, Riichiro Takaishi, Tomoya Kawai, Yuuichi Kamimuta, Toshiya Murakami, Keiko Ariyoshi, Takanori Asano, Masakazu Goto, Makoto Fujiwara, Yuichiro Mitani, Tomoyuki Obu, Hideaki Aochi, "Metal-Assisted Solid-Phase Crystallization Process for Vertical Monocrystalline Si Channel in 3D Flash Memory," pp. 650-653, IEDM (2019)), while changing a dopant, an n layer 922, a p layer 902, and an n layer 903, which are silicon layers, are formed. Subsequently, by using a process that is the same as that shown from FIGS. 10-3E to 10-4H, a cell can be formed.

As shown in FIGS. 10-1A to 10-4H or in FIGS. 11-1A to 11-3F, by repeating a plurality of times, the process of laminating sacrificial layers and silicon layers, and by performing the process of forming a bit line hole in the laminated structure including a plurality of layers, it can be easily conceived that the three-dimensional memory cell array described in the second embodiment can be realized. In addition, it is possible to realize a higher-density memory without increasing the planar-view cell area as long as the initial number of laminations is increased.

The third embodiment of the present invention has the following features.

Feature 1

All of the structural elements of the memory according to the third embodiment of the present invention can be formed by a standard MOS process, and as long as a laminated structure in which a sacrificial layer and a semiconductor layer are repeatedly formed is formed, it is possible to, without changing the planar-view area, realize a laminated cell and a high-density cell array.

Feature 2

The gate insulating layer and the gate conductor layer to which a word line, which is a structural element of the memory according to the third embodiment of the present invention, is connected, and a gate insulating layer and a gate conductor layer to which a plate line is connected are separately formed. Therefore, it is possible to select an optimum condition for each of a write operation, a read operation, and an erase operation of the memory cell.

Feature 3

With regard to the material that fills the bit line hole, there can be a wide range of choices and a low-resistance material can be used.

According to the present invention, it is possible to provide a semiconductor memory device having a higher density, a higher speed, and a higher operating margin than semiconductor memory devices of the related art.

What is claimed is:
1. A memory cell using a semiconductor element, comprising:
   a first semiconductor region that extends in a direction perpendicular to a substrate;
   a second semiconductor region that surrounds a part of the first semiconductor region and that is connected thereto;
   a third semiconductor region that surrounds a part of the second semiconductor region and that is connected thereto;
   a first dielectric film that covers a part of an upper surface of the second semiconductor region;
   a first gate conductor layer that contacts an upper surface of the first dielectric film;
   a second dielectric film that covers a part of a lower surface of the second semiconductor region; and
   a second gate conductor layer that contacts the second dielectric film and whose shortest distance from the first semiconductor region is larger than a shortest distance between the first gate conductor layer and the first semiconductor region, wherein the memory cell is configured such that a source line is connected to the third semiconductor region, a bit line is connected to the first semiconductor region, a word line is connected to the first gate conductor layer, a plate line is connected to the second gate conductor layer, and a voltage is applied to each of the source line, the bit line, the plate line, the word line, and a control line to perform a write operation, an erase operation, and a read operation, and when the erase operation of the memory cell is performed, the voltage is applied to only either one of the source line and the bit line.

2. The memory cell using a semiconductor element according to claim 1, wherein when the read operation or the write operation is performed, polarities of the voltages that are applied to the bit line and the word line are same and differ from a polarity of the voltage that is applied to the plate line.

3. The memory cell using a semiconductor element according to claim 1, wherein when the erase operation is performed, a voltage having a polarity that is same as a polarity of the voltage that is applied to the plate line is applied to either one of the source line and the bit line, or the voltages that are applied to the source line and the bit line are both 0 V.

4. The memory cell using a semiconductor element according to claim 1, wherein the second dielectric film is thicker than the first dielectric film.

5. The memory cell using a semiconductor element according to claim 1, wherein majority carriers of the first semiconductor region and the third semiconductor region are same and differ from a majority carrier of the second semiconductor region.

6. The memory cell using a semiconductor element according to claim 1, wherein a first metal layer is used in place of the first semiconductor region.

7. The memory cell using a semiconductor element according to claim 6, wherein the first semiconductor region is used around the first metal layer.

8. The memory cell using a semiconductor element according to claim 1, further comprising:

a first metal layer that is connected to an inner portion of the first semiconductor region.

9. The memory cell using a semiconductor element according to claim 1, wherein an outer periphery of the third semiconductor region is covered by a metal layer.

10. A memory device using a semiconductor element, comprising:

a plurality of memory cells, each being the memory cell according to claim 1, that are laid out in a plane, wherein the second semiconductor region, the third semiconductor region, the first dielectric film, the first gate conductor layer, the second dielectric film, and the second gate conductor layer are shared by the plurality of memory cells that are adjacent to each other in a horizontal direction; other than the first semiconductor region, the memory cells are isolated by a first insulating layer in a perpendicular direction; the first semiconductor region is shared by the memory cells in the perpendicular direction; and the plurality of memory cells are laminated in the perpendicular direction.

11. A memory device using a semiconductor element, wherein the memory cells according to claim 10 are disposed by being isolated by a second insulating layer in the horizontal direction.

12. The memory device using a semiconductor element according to claim 10, wherein the second gate conductor layer is shared by the memory cells that are adjacent to each other in the perpendicular direction.

* * * * *